United States Patent

Nakagaki et al.

[11] 4,100,501
[45] Jul. 11, 1978

[54] AUDIO FREQUENCY POWER AMPLIFIER

[75] Inventors: Harushige Nakagaki, Yokohama; Tohru Sampei, Toyokawa; Nobutaka Amada, Toyokawa; Tatsuo Baba, Toyokawa, all of Japan

[73] Assignee: Hitachi, Ltd., Japan

[21] Appl. No.: 767,963

[22] Filed: Feb. 11, 1977

[30] Foreign Application Priority Data

Feb. 12, 1976 [JP] Japan ................................. 51-13220
Feb. 18, 1976 [JP] Japan ................................. 51-16012

[51] Int. Cl.$^2$ ............................................... H03F 3/26
[52] U.S. Cl. .................................... 330/263; 330/255; 330/267; 330/297
[58] Field of Search ............... 330/255, 263, 267, 268, 330/297, 199

[56] References Cited

U.S. PATENT DOCUMENTS 3,854,057  12/1974  Williams et al. .................... 330/13 X
3,961,280  6/1976  Sampei .............................. 330/13 X Primary Examiner—Lawrence J. Dahl
Attorney, Agent, or Firm—Craig & Antonelli

[57] ABSTRACT

An audio frequency power amplifier wherein an input signal is applied to respective input electrodes of a pair of transistors of the same conductivity type to produce an output signal at an output electrode of one of the pair of transistors. A common electrode of the one transistor is connected with an output electrode of the other transistor and a power from a first D.C. power supply is supplied to the junction thereof through a diode while a power is supplied to a common electrode of the other transistor from a second D.C. power supply having a higher voltage than that of the first D.C. power supply. The other transistor and the diode are alternately rendered conductive and non-conductive in response to the signal level of the input signal, a capacitor is connected to the input electrode of the other transistor, which capacitor is charged during the turn-off of the other transistor whereby the charge is supplied to the other transistor upon turning on of the other transistor to shorten the rise time.

8 Claims, 2 Drawing Figures

AUDIO FREQUENCY POWER AMPLIFIER

The present invention relates to an audio frequency power amplifier for amplifying an audio frequency signal for feeding a load such as a loud speaker or the like.

A class-B push-pull amplifier circuit has been used as an audio frequency power amplifier to amplify an audio frequency signal recorded on a disk record or a magnetic tape. Since the class-B push-pull amplifier has a higher efficiency than a class-A push-pull amplifier, it is suitable for use in a high power amplifier. However, even with the class-B push-pull amplifier, the efficiency thereof decreases for a low power output although the efficiency for a high power output is relatively high.

For example, where an emitter follower type audio frequency power amplifier is constructed by a single transistor, the efficiency $\eta$ of the amplifier can be given by the following expression:

$$\eta = \frac{\text{power consumed by load resistor}}{\text{power supplied from power supply}} = \frac{V_{in}}{V_{cc}} \quad (1)$$

where $V_{cc}$ is power supply voltage and $V_{in}$ is an input signal voltage applied to a base of the transistor. Thus, the efficiency $\eta$ increases as the input signal voltage $V_{in}$ approaches the power supply voltage $V_{cc}$.

The audio frequency power amplifier for amplifying the audio frequency signal, however, must be operated in such a fashion that the input signal voltage never exceeds the power supply voltage. If the input signal voltage exceeds the power supply voltage, the signal is clipped causing a distortion which deteriorates the quality of reproduced sound.

While the mean level of a music signal recorded on a disk record or a magnetic tape is relatively low, a high level signal such as that for a percussion instrument may sometimes be included therein. In order to amplify such a high level signal without distortion, the mean signal voltage must be established to a signal level which is considerably lower than the power supply voltage. This means that the class-B push-pull amplifier is used under a low efficiency condition.

In order to enhance the efficiency of the amplifier for a low power output, an audio frequency amplifier has been proposed which includes two power supplies of different voltages so that the power supplies are selectively used depending on the level of the input signal.

In such a proposed amplifier, the collector of a first transistor of one conductivity type is connected to the emitter of a second transistor of the same conductivity type, and a first D.C. power supply is connected through a diode between the junction of the collector of the first transistor and the emitter of the second transistor and a reference potential source.

An input signal is applied to the bases of the first and second transistors and a load is connected between the emitter of the first transistor and the reference potential source. A second D.C. power supply having a voltage higher than that of the first D.C. power supply is connected between the collector of the second transistor and the reference potential source. Thus, when the signal level of the input signal is lower than the voltage level of the first D.C. power supply, the second transistor is reverse biased to the cut-off condition by the first D.C. power supply while the first transistor is powered by the first D.C. power supply through the diode, and when the signal level of the input signal is higher than the voltage level of the first D.C. power supply, the second transistor is forward biased into conduction by the signal voltage while the first transistor is powered by the second D.C. power supply through the second transistor. As for the diode, when the signal level of the input signal is lower than the voltage level of the first D.C. power supply, the diode is forward biased into conduction by the first D.C. power supply, and when the signal level of the input signal is higher than the voltage level of the first D.C. power supply, the diode is reverse biased into cutoff condition by the second D.C. power supply. When the signal level of the input signal is relatively low, the first transistor is powered with the lower voltage from the first D.C. power supply so that the efficiency is enhanced, and when the signal level of the input signal is relatively high, the first transistor is powered with the higher voltage from the second D.C. power supply so that the input signal is amplified without clipping.

In this type of amplifier, however, since the second transistor is switched between its conduction state and the cutoff state depending on the signal level of the input signal, the distortion is included in the signal when the state of the second transistor is switched. Namely, there is included a time delay in switching the second transistor from its cutoff state to its conduction state, and the first transistor and the load are not powered during such a delay period, resulting in a distortion in the resulting signal. Furthermore, where third and fourth transistors are additionally arranged in a preceeding stage to the first and second transistors such that the first and third transistors and the second and fourth transistors are connected in a Darlington circuit arrangement, respectively, to form a high power amplifier, a charge is stored in the base-collector capacitance of the fourth transistor when the second and fourth transistors conduct, and the stored charge is then supplied to the second transistor when the second and fourth transistors are reverse biased. The stored charge may be large enough to cancel out the reverse bias causing the second transistor to be forward biased into conduction, which in turn causes the application of the higher voltage of the second D.C. power supply to the first transistor. In other words, when the signal level of the input signal decreases to such a level that the second and fourth transistors should be non-conductive, the second transistor maintains its conduction state and applies the higher voltage to the first transistor. As a result, the efficiency of the circuit is lowered. It is also required that the first transistor can withstand a high operating voltage.

It is an object of the present invention to provide a low distortion and high efficiency audio frequency power amplifier.

It is another object of the present invention to provide a low distortion and high efficiency audio frequency power amplifier using low breakdown voltage transistors.

According to the present invention, a power amplifier is provided wherein the collector of a first transistor of one conductivity type is connected with the emitter of a second transistor of the same conductivity type and a common input signal is applied to the bases of those transistors to produce an output signal from the emitter of the first transistor. The collector of the first transistor is powered from a first D.C. power supply through the diode and a collector of the second transistor is powered from a second D.C. power supply having a voltage higher than that of the first D.C. power supply. A capacitor is connected between the base of the second transistor and a reference potential source so that when the second transistor is non-conductive, the capacitor is charged by the first D.C. power supply and when the second transistor is rendered conductive, the charge stored is fed to the second transistor to rapidly conduct the second transistor.

The circuit of the present invention is advantageously used with a high power amplifier in which third and fourth transistors are additionally arranged in a preceeding stage to the first and second transistors in such a fashion that the first and third transistors and the second and fourth transistors, respectively, are connected in Darlington circuit arrangement. In this case, a capacitor is connected between a base of the fourth transistor and the reference potential source so that when the second and fourth transistors are non-conductive, the capacitor is charged by the first D.C. power supply and when the second and fourth transistors are rendered conductive, the charge stored is fed to the fourth transistor to rapdily conduct the second and fourth transistors. In addition, a resistor is connected between the base of the second transistor and the reference potential source so that a charge stored in a base-collector capacitance of the fourth transistor is by-passed through the resistor during the cutoff state of the second and fourth transistors to rapidly cutoff the second transistor.

According to the power amplifier of the present invention, the power consumption of the amplifier is reduced and hence the efficiency of the amplifier is enhanced. At the same time, the distortion for a large input signal is reduced. In addition, the requirement for a breakdown voltage of a power transistor can be relieved.

The above and other objects, features and advantages of the present invention will become more apparent from the following detailed description of the preferred embodiments when taken in conjunction with the accompanying drawings, in which.

Figure 1:
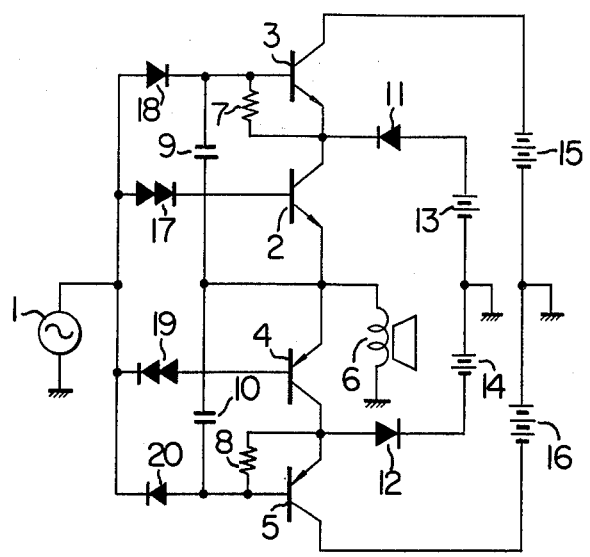
FIG. 1 is a basic circuit diagram illustrating one embodiment of an audio frequency power amplifier of the present invention.

Referring to FIG. 1 which shows a basic circuit diagram of an audio frequency power amplifier of the present invention, there is shown a push-pull amplifier arrangement. In FIG. 1, an input signal source 1 to the amplifier has one terminal thereof grounded and the other terminal thereof connected to bases of four transistors 2, 3, 4 and 5 through diodes 17, 18, 19 and 20, respectively. The first and second transistors 2 and 3 are power transistors of the same conductivity type, which are of NPN type in the illustrated example. The third and fourth transistors 4 and 5 are power transistors of the same conductivity type relative to each other and of the opposite conductivity type to that of the first and second transistors. They are of PNP type in the illustrated example. The collector of the transistor 2 is connected to the emitter of the transistor 3, while the collector of the transistor 4 is connected to the emitter of the transistor 5. Emitters of the first and third transistors 2 and 4 are connected together and a loud speaker 6 as a load is connected between the junction of the emitters of the transistors 2 and 4 and ground. A resistor 7 as an impedance element is connected between the base and the emitter of the transistor 3 and a first capacitor 9 is connected between the base of the transistor 3 and the emitter of the transistor 2. A resistor 8 as an impedance element is connected between the base and the emitter of the transistor 5 and a second capacitor 10 is connected between the base of the transistor 5 and the emitter of the transistor 4. The resistors 7 and 8 may be replaced by diodes Connected to the collector of the transistor 2 is the cathode of the first diode 11, the anode of which is connected to the positive terminal of a first D.C. power supply 13. Connected to the collector of the transistor 4 is the anode of a second diode, the cathode of which is connected to a negative terminal of a second D.C. power supply 14. The first and second D.C. power supplies 13 and 14 are equal in their absolute value, and the negative terminal of the first D.C. power supply 13 and the positive terminal of the second D.C. power supply 14 are both grounded. A third D.C. power supply 15 and a fourth D.C. power supply 16 are equal in their absolute value and have a voltage higher than that of the first and second D.C. power supplies 13 and 14. The positive terminal of the third D.C. power supply 15 is connected to the collector of the transistor 3 while the negative terminal thereof is grounded. The negative terminal of the fourth D.C. power supply is connected to the collector of the transistor 5 while the positive terminal thereof is grounded.

The set of the first and second transistors 2 and 3 and the set of the third and fourth transistors 4 and 5 operate as a complementary circuit to each other such that an output signal is fed to the load 6 from a single output terminal forming a single ended push-pull circuit.

In the operation of the circuit described above, the transistors 2 and 3 are rendered conductive during each positive half cycle of the audio frequency signal supplied from the signal source 1 and amplify the signal for feeding the load 6. The transistors 4 and 5 are rendered conductive during each negative half cycle of the audio frequency signal and amplify the signal for feeding the load 6. When the transistor conducts, the diode 11 is forward biased into conduction by the power supply 13 and supplies the forward current therethrough to the collector of the transistor 2 as the collector current thereof. When the signal voltage of the audio frequency signal applied to the bases of the transistors 2 and 3 during the positive half cycle is lower than the collector voltage of the transistors 2, the transistor 3 is reverse biased into the cutoff state by the collector voltage of the transistor 2. Thus, when the signal level of the audio freuqency signal is relatively low, the transistor 2 is powered from the power supply 13 so that the signal is amplified only by the transistor 2. In this case, since the voltage of the power supply 13 is low, the power fed to the load 6 approaches the power fed from the power supply 13 so that the amplifier operates at a high efficiency.

When the signal level of the audio frequency signal applied to the bases of the transistors 2 and 3 during the positive half cycle exceeds the collector voltage of the transistor 2, the transistor 3 is forward biased into conduction by the signal voltage so that the collector of the transistor 2 is powered from the power supply 15 through the transistor 3. Because the voltage of the power supply 15 is applied to the collector of the transistor 2, the collector voltage thereof exceeds the voltage of the power supply 13 so that the diode 11 is reverse biased into the cutoff state. As a result, the transistors 2 and 3 are powered from the power supply 15 to amplify the signal during the positive half cycle.

Similarly, the transistors 4 and 5 and the diode 12 operate during each negative half cycle of the input signal such that the diode 12 is forward biased by the power supply 14 to conduct when the absolute value of the signal voltage during the negative half cycle of the input signal is smaller than the absolute value of the collector voltage of the transistor 4. As a result, the transistor 5 is rendered non-conductive. When the absolute value of the signal voltage during the negative half cycle of the input signal exceeds the absolute value of the collector voltage of the transistor 4, the transistor 5 is rendered conductive by the signal voltage and the diode 12 is rendered non-conductive.

The diodes 17 and 19 connected to the bases of the first and third transistors 2 and 4 are biasing diodes for biasing the second and third transistors 3 and 5 into conduction before the transistors 2 and 4 are saturated. When the transistors 2 and 4 are saturated, carriers are stored in the bases of the transistors 2 and 4. As a result, a delay occurs when the transistors 2 and 4 are restored to the non-saturation state. In order to avoid such a delay, the diodes 17 and 19 are connected to the bases of the transistors 2 and 4, respectively. Thus, due to the voltage drops across the diodes 17 and 19, the transistors 3 and 5 are rendered conductive before the transistors 2 and 4, respectively, are saturated. The diodes 18 and 20 connected to the bases of the second and fourth transistors 3 and 5 function to prevent the voltages applied to the bases of the transistors 3 and 5 during the cutoff state thereof from exceeding the base-to-emitter reverse breakdown voltage.

In this manner, the second and fourth transistors 3 and 5 are switched between the conduction state and the non-conduction state depending on the signal level of the input signal. When the transistors 3 and 5 are switched from their non-conduction state to their conduction state, the switching should be rapidly carried out. The capacitors 9 and 10 are connected between the base of the transistor 3 and the emitter of the transistor 2, and between the base of the transistor 5 and the emitter of the transistor 4, respectively, and the resistors 7 and 8 as the impedance elements are connected between the base and the emitter of the transistor 3 and between the base and the emitter of the transistor 5, respectively. When the signal level of the input signal is low and the transistor 2 is conductive while the transistor 3 is non-conductive, the capacitor 9 is charged with the voltage of the power supply 13 through the resistor 7 so that the base potential of the transistor 3 is substantially equal to the voltage of the power supply 13, when the signal level of the input signal then goes up above the voltage of the power supply 13, the charge stored in the capacitor 9 flows into the base of the transistor 3 to shorten the rise time upon turning on of the transistor 3. Similarly, the capacitor 10 is charged with the voltage of the power supply 14 through the resistor 8 during the cutoff state of the transistor 5, and the charge stored then flows into the base of the transistor 5 upon turning on of the transistor 5 to shorten the rise time of the transistor 5. In this manner, the transistors 3 and 5 rapidly conduct and the distortion, which otherwise occurs when the transistors 3 and 5 are switched from the nonconduction state, to the conduction state is eliminated.

Since the emitters of the transistors 2 and 4 are at ground potential when a zero level input signal is applied, the capacitances 9 and 10 may be connected between the bases of the transistors 3 and 5, respectively, and ground. In the absence of the resistors 7 and 8, a leakage current between the collector and the base of the transistor 3 and a leakage current between the collector and the base of the transistor 5 cause the capacitors 9 and 10, respectively, to be charged from the power supplies 15 and 16, respectively. Accordingly, the resistors 7 and 8 are not necessarily connected. However, when the leakage currents are small, it is preferably to connect the resistors 7 and 8 between the bases and the emitters of the transistors 3 and 5, respectively, because it is desired to speed up the charging of the capacitances 7 and 8 by the connection of the resistors 7 and 8 and the reverse breakdown voltage of the transistors 3 and 5 can be increased by the connection of the resistors between the base-emitter circuits of the transistors 3 and 5.

Figure 2:
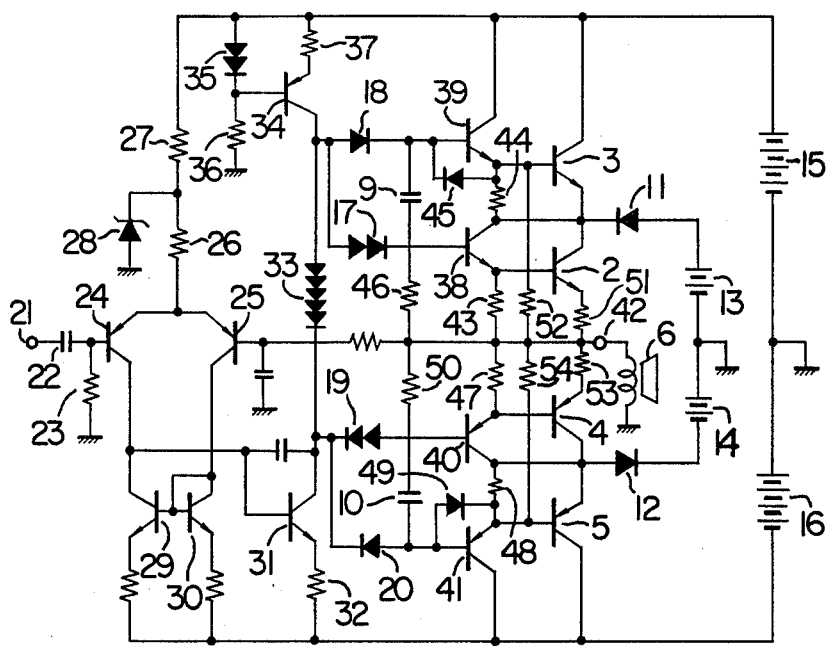
FIG. 2 is a specific circuit diagram illustrating another embodiment of the present invention.

FIG. 2 shows a specific circuit diagram of an audio frequency power amplifier in accordance with the present invention. In FIG. 2, an input terminal 21 is connected through a capacitor 22 to the base of a PNP transistor 24 for amplifying a small signal. The base of the transistor 24 is biased through a resistor 23, and the emitter of the transistor 24 is connected to the emitter of another PNP transistor 25 and also connected to a power supply 15 through resistors 26 and 27 to form, together with the transistor 25, a differential amplifier. A zener diode 28 is connected between the junction of the resistors 26 and 27 and ground to maintain a constant voltage at the emitters of the transistors 24 and 25. The collector of the transistor 24 is connected to the collector of a constant current feeding NPN transistor 29, and the collector of the transistor 25 is connected to the collector of a diode-connected NPN transistor 30. The collector of the transistor 24 is also connected to the base of a second small signal amplifying NPN transistor 31. A signal applied to the input terminal 21 is amplified by the transistor 24 and an output at the collector thereof is supplied to the base of the transistor 31. The emitter of the transistor 31 is connected to the power supply 16 through the resistor 32, and a collector thereof is connected to the collector of the constant current feeding PNP transistor 34 through a plurality of biasing diodes 33. The diodes 33 are connected in series with each other to provide a predetermined bias voltage to a succeeding stage transistor. A predetermined voltage is developed across the series connection of the diodes 33. It also serves as a temperature compensation means for the succeeding stage. The transistor 34 functions as a constant current source, and the base thereof is connected to the power supply 15 through a plurality of series-connected diodes 35 and also connected to the ground through a resistor 36. The emitter of the transistor 34 is connected to the power supply 15 through a resistor 37. The collector of the transistor 34 is connected through a plurality of series-connected diodes 17 to a base of a first driving NPN transistor 38, and also connected to a base of a second driving NPN transistor 39 through a diode 18. The collector of the transistor 31 is connected to the base of a third driving PNP transistor 40 through a plurality of series-connected diodes 19 and further connected to the base of a fourth driving PNP transistor 41 through a diode 20. The emitter of the transistor 38 is connected to an output terminal 42 the stabilizing bias resistor 43 and further connected to a base of a first output NPN transistor 2. The emitter of the transistor 39 is connected to a collector of the transistor 38 through a bias resistor 44 and further connected to the base of a second output NPN transistor 3. A diode 45 as an impedance element is connected between the base and the emitter of the transistor 39. The diode 45 corresponds to the resistor 7 shown in FIG. 1 and it may be replaced by a resistor. The collector of the transistor 39 is connected to the power supply 15, and a series connection of a capacitor 9 and the resistor 46 is connected between the base of the transistor 39 and the output terminal 42. The emitter of the transistor 40 is connected to the output terminal 42 through a resistor 47 and further connected to the base of the third output PNP transistor 4. The collector of the transistor 40 is connected to the emitter of a transistor 41 through a resistor 48 and further connected directly to the collector of a transistor 4. The emitter of the transistor 41 is connected to the base of a fourth output PNP transistor 5, and a diode 49 as an impedance element is connected between the base and the emitter of the transistor 41. The collector of the transistor 41 is connected to a power supply 16, and a series connection of a capacitor 10 and a resistor 50 is connected between the output terminal 42 and the base of the transistor 41. The emitter of the transistor 2 is connected to the output terminal 42 through a protecting resistor 51, and the collector thereof is connected directly to an emitter of the transistor 3 and the collector of the transistor 38. The collector of the transistor 2 is further connected to a power supply 13 through a diode 11. The collector of the transistor 3 is connected to the power supply 15, and a resistor 52 is connected between the base of the transistor 3 and the output terminal 42. A resistor 53 is connected between the emitter of the transistor 4 and the output terminal 42, and the collector of the transistor 4 is connected to the emitter of the transistor 5 and further connected to a power supply 14 through a diode 12. The collector of the transistor 5 is connected to the power supply 16, and a resistor 54 is connected between the base of the transistor 5 and the output terminal 42.

The amplifier shown in FIG. 2 includes the four driving transistors 38, 39, 40 and 41 for independently driving the four output transistors 2, 3, 4 and 5, respectively. The bases of the output transistors 2, 3, 4 and 5 are connected directly to the emitters of the driving transistors 38, 39, 40 and 41, respectively, forming Darlington configurations. For example, the output transistor 3 and the driving transistor 39 which is Darlington connected therewith operates as if it is a single NPN transistor having a current amplification factor equal to a product of respective current amplification factors of the transistors 3 and 39. It is, therefore, suitable for use as a high power amplifier.

An amplified signal at the collector of the small signal amplifying transistor 31 is fed to the four driving transistors 38, 39, 40 and 41 through the diodes 17, 18, 19 and 20. The transistors 38 and 39 conduct during each positive half cycle of the signal while the transistors 40 and 41 conduct during each negative half cycle of the signal. In this manner, a push-pull mode of operation is carried out. Output signals from the driving transistors 38, 39, 40 and 41 are fed to the output transistors 2, 3, 4 and 5, respectively, where they are further amplified and thence fed to the loud speaker 6 connected between the output terminal 42 and the ground, where they are converted to sound signals. When the absolute value of the input signal voltage is lower than the absolute value of the voltage of the power supply 13 or 14, the transistors 39 and 41 are non-conductive and hence the transistors 3 and 5 are also non-conductive. When the transistor 39 is non-conductive, a charging current flows from the power supply 13 into the series circuit of the capacitor 9 and the resistor 46 through the diode 45 to charge the capacitor 9 to a voltage substantially equal to the voltage of the power supply 13. When the transistor 39 is then rendered conductive, the charge stored flows into the base of the transistor 39 to shorten the rise time of the transistor 39. In a similar manner, a charging current flows to the series circuit of the capacitor 10 and the resistor 50 through the diode 49 when the transistor 41 is non-conductive so that a charge is stored in the capacitor 10. The resistors 46 and 50 connected in series with the capacitors 9 and 10, respectively, serve to prevent the oscillation of the amplifier. In the absence of those resistors, the capacitors 9 and 10 would act as the load for the transistor 31 causing the transistor 31 to oscillate. Accordingly, the resistors 46 and 50 should be connected in series to prevent the capactive load.

When the signal level of the signal applied to the base of the transistor 39 during the positive half cycle exceeds the voltage of the power supply 13, the transistors 3 and 39 are rendered conductive. During this cycle, the base-collector capacitances of the transistors 3 and 39 are charged with the power supply 15, and when the transistor 3 and 39 are then rendered non-conductive, the stored charge flows into the base of the transistor 3 so that the transistor 3 may be again rendered conductive. By connecting the output transistor 3 and the drive transistor 39 in the Darlington configuration, the current amplification factor can be increased so that the charged stored in the base-collector capacitance of the drive transistor 39, even if it is of small quantity, is amplified by the transistor 39 to a large discharging current, which is fed to the base of the transistor 3 as a base current thereof to prevent the cutoff of the transistor 3. The resistor 52 connected between the base of the transistor 3 and the output terminal 42 serves to bypass the charges stored in the base-collector capacitances of the transistors 3 and 39. Namely, when the signal level of the input signal during the positive half cycle goes down below the voltage of the power supply 13, the charge stored in the base-collector capacitance of the transistor 39 is discharged through the base-emitter junction of the transistor 39 and the resistor 52. The charge stored in the base-collector capacitance of the transistor 3 also discharges through the resistor 52 so that the transistor 3 is rendered non-conductive. The charges stored in the base-collector capacitances of the transistors 5 and 41 also discharge through the resistors 54 so that the transistor 5 is rendered non-conductive. Accordingly, the conduction state and the non-conduction state of the transistors 3 and 5 are well defined and the duration of the high voltages applied to the transistors 2 and 4 are shortened. As a result, the transistors 2 and 4 can be low breakdown voltage transistors and at the same time the reduction of the efficiency of the amplifier can be prevented.

What is claimed is:

1. An audio frequency power amplifier comprising:
    first and second transistors of one conductivity type each having an input electrode, a common electrode and an output electrode;
    means for applying an input signal to the respective input electrodes of said first and second transistors;
    a load connected to the output electrode of said first transistor;

a first D.C. power supply connected to the common electrode of said first transistor for energizing said first transistor and said load;

a diode connected between the common electrode of said first transistor and said first D.C. power supply in a forward direction to a current flowing from said first D.C. power supply;

means for D.C. coupling the common electrode of said first transistor to the output electrode of said second of transistor;

a second D.C. power supply connected to the common electrode of said second transistor and having a voltage higher than that of said first D.C. power supply for energizing said first and second transistors and said load when said second transistor is conductive;

a capacitor connected between the input electrode of said second transistor and the output electrode of said first transistor; and means for charging up said capacitor when said second transistor is non-conductive.

2. An audio frequency power amplifier comprising:

a pair of transistors of one conductivity type each having an input electrode, a common electrode and an output electrode;

means for applying an input signal to the respective input electrodes of said pair of transistors;

a load connected to the output electrode of one of said pair of transistors;

a first D.C. power supply connected to the common electrode of said one transistor for energizing said one transistor and said load;

a diode connected between the common electrode of said one transistor and said first D.C. power supply in a forward direction to a current flowing from said first D.C. power supply;

means for D.C. coupling the common electrode of said one transistor to the output electrode of the other of said pair of transistors;

a second D.C. power supply connected to the common electrode of said other transistor and having a voltage higher than that of said first D.C. power supply for energizing said pair of transistors and said load when said other transistor is conductive;

a capacitor connected between the input electrode of said other transistor and the output electrode of said one transistor; and an impedance element connected between the input electrode and the output electrode of said other transistor.

3. An audio frequency push-pull power amplifier comprising;

first and second transistors of one conductivity type each having an input electrode, a common electrode and an output electrode;

third and fourth transistors of opposite conductivity type to that of said first and second transistors each having an input electrode, a common electrode and an output electrode;

a means for applying an input signal to the respective input electrodes of said first, second, third and fourth transistors;

a load connected to the output electrodes of said first and third transistors;

a first D.C. power supply connected to the common electrode of said first transistor for energizing said first transistor and said load;

a second D.C. power supply connected to the common electrode of said third transistor connected in opposite polarity to said first D.C. power supply and having a voltage equal in absolute value to that of said first D.C. power supply for energizing said third transistor and said load;

a first diode connected between the common electrode of said first transistor and said first D.C. power supply in a forward direction to a current flowing from said first D.C. power supply;

a second diode connected between the common electrode of said third transistor and said second D.C. power supply in a forward direction to current flowing from said second D.C. power supply;

means for D.C. coupling the common electrode of said first transistor to the output electrode of said second transistor;

a third D.C. power supply connected to the common electrode of said second transistor and having a voltage higher than that of said first D.C. power supply for energizing said first and second transistors and said load when said second transistor is conductive;

a means for D.C. coupling the common electrode of said third transistor to the output electrode of said fourth transistor;

a fourth D.C. power supply connected to the common electrode of said fourth transistor in opposite polarity to said third D.C. power supply and having a voltage equal in absolute value to that of said third D.C. power supply for energizing said third and fourth transistors and said load when said fourth transistor is conductive;

first and second impedance elements connected between the respective input electrodes and the respective output electrodes of said second and fourth transistors; and first and second capacitors connected between the respective input electrodes of said second and fourth transistors and the respective output electrodes of said third and fourth transistors.

4. An audio frequency push-pull power amplifier according to claim 3 wherein said first and second impedance elements are resistors.

5. An audio frequency push-pull power amplifier according to claim 3 wherein said first and second impedance elements connected in the forward direction to the currents flowing into said first and second capacitors, respectively, are diodes.

6. An audio frequency push-pull power amplifier according to claim 3 further including resistors each connected in series with said first and second capacitors, respectively.

7. An audio frequency power amplifier comprising;

a pair of driving transistors each having an input electrode, a common electrode and an output electrode;

a means for applying an input signal to the respective input electrodes of said pair of driving transistors;

a first output transistor having an input electrode connected to the output electrode of one of said pair of driving transistors and having a common electrode and an output electrode;

a second output transistor having an input electrode connected to the output electrode of the other of said pair of driving transistor and an output electrode connected to the common electrode of said first output transistor and having a common electrode;

a load connected between the output electrode of said first output transistor and a reference potential source, a first D.C. power supply for energizing said one driving transistor, said first output transistor and said load;

a diode connected between the respective common electrodes of said one driving transistor and said first output transistor and said first D.C. power supply in a forward direction to a current flowing from said first D.C. power supply;

a second D.C. power supply connected between the respective common electrodes of said other driving transistor and said second output transistor and said reference potential source and having a voltage higher than that of said first D.C. power supply;

a resistor connected between the input electrode of said second output transistor and the output electrode of said first output transistor; and a capacitor connected between the input electrode of said other driving transistor and the output electrode of said first output transistor.

8. An audio frequency power amplifier according to claim 7 further including a resistor connected between the common electrode of said one driving transistor and the output electrode of said other driving transistor, and an impedance element connected between the input electrode and the output electrode of said other driving transistor.

* * * * *